(12) United States Patent
Zhang et al.

(10) Patent No.: US 11,398,407 B2
(45) Date of Patent: Jul. 26, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hao Zhang, Shanghai (CN); Xuezhen Jing, Shanghai (CN); Jingjing Tan, Shanghai (CN); Tiantian Zhang, Shanghai (CN); Zhangru Xiao, Shanghai (CN); Zengsheng Xu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/987,556

(22) Filed: Aug. 7, 2020

(65) Prior Publication Data
US 2021/0043505 A1 Feb. 11, 2021

(30) Foreign Application Priority Data
Aug. 9, 2019 (CN) .......................... 201910733492.8

(51) Int. Cl.
*H01L 21/768* (2006.01)
*H01L 21/285* (2006.01)
*H01L 23/535* (2006.01)

(52) U.S. Cl.
CPC .... *H01L 21/76846* (2013.01); *H01L 21/7684* (2013.01); *H01L 21/76864* (2013.01); *H01L 23/535* (2013.01)

(58) Field of Classification Search
CPC ........... H01L 21/76846; H01L 21/7684; H01L 21/76864; H01L 23/535; H01L 21/76855; H01L 2221/1063; H01L 21/76844; H01L 21/76883; H01L 21/28518; H01L 21/76895; H01L 21/76838; H01L 21/76865; H01L 23/481
See application file for complete search history.

(56) References Cited

PUBLICATIONS

Junichi Koike et al., New Contact Metallization Scheme for FinFET and Beyond, 2018 IEEE Electron Devices Technology and Manufacturing Conference Proceedings of Technical Papers, 2018, Kobe Japan.

*Primary Examiner* — David Vu
(74) *Attorney, Agent, or Firm* — Anova Law Group, PLLC

(57) ABSTRACT

A method for forming a semiconductor structure includes forming a dielectric layer with an opening on a substrate; forming a material film in the opening; forming a blocking film on the material film; and removing the blocking film at the bottom of the opening to expose the material film. The remaining blocking film forms an initial blocking layer. The method further includes forming a conductive-material film in the opening; performing an annealing process to form a contact layer at the bottom of the opening by making the substrate, the material film, and the conductive-material film react with each other; and planarizing the conductive-material film, the initial blocking layer, and the material film to expose the dielectric layer. The remaining initial blocking layer forms a blocking layer in the opening; and the remaining conductive-material film forms a plug in contact with the blocking layer and the contact layer.

15 Claims, 6 Drawing Sheets

SEMICONDUCTOR DEVICE AND FABRICATION METHOD THEREOF

CROSS-REFERENCES TO RELATED APPLICATIONS

This application claims the priority of Chinese Patent Application No. CN201910733492.8, filed on Aug. 9, 2019, the entire content of which is incorporated herein by reference.

FIELD OF THE DISCLOSURE

The present disclosure generally relates to the field of semiconductor manufacturing and, more particularly, relates to semiconductor structures and fabrication methods thereof.

BACKGROUND

Currently, in semiconductor manufacturing process, to form an electrical connection between semiconductor devices, a widely adopted process is to form an opening in an interlayer dielectric layer, and then deposit a conductive material in the opening. In order to reduce the contact resistance, during the process of forming the electrical connection, a metal layer is usually deposited on the bottom and sidewall surfaces of the opening, and then a rapid annealing process is performed so that the metal layer at the bottom of the opening reacts with the substrate. As such, a metal silicide layer is formed on the bottom of the opening, thereby reducing the contact resistance.

However, the performance of semiconductor structures formed using the existing technology may still need to be improved. The disclosed semiconductor structures and fabrication methods thereof are directed to solve one or more problems set forth above and other problems in the art.

BRIEF SUMMARY OF THE DISCLOSURE

One aspect of the present disclosure provides a method for forming a semiconductor structure. The method includes: forming a dielectric layer on a substrate; forming an opening in the dielectric layer to expose a surface portion of the substrate; forming a material film on the bottom and sidewall surfaces of the opening, and on the top surface of the dielectric layer; forming a blocking film on the material film; and removing a portion of the blocking film to expose the surface of the material film at the bottom of the opening. The remaining portion of the blocking film forms an initial blocking layer. The method further includes forming a conductive-material film in the opening, and above the top surface of the dielectric layer; performing an annealing process to form a contact layer at the bottom of the opening by making the substrate at the bottom of the opening, the material film at the bottom of the opening, and the conductive-material film formed on the surface of the material film react with each other; and after forming the contact layer, planarizing the conductive-material film, the initial blocking layer, and the material film until the top surface of the dielectric layer is exposed. The remaining portion of the initial blocking layer forms a blocking layer on the sidewall surface of the opening; and the remaining portion of the conductive-material film forms a plug in contact with the blocking layer and the contact layer.

Optionally, removing the portion of the blocking film to expose the surface of the material film at the bottom of the opening includes: forming a sacrificial film on the blocking film; removing a portion of the sacrificial film until the portion of the blocking film at the bottom of the opening is exposed, a remaining portion of the sacrificial film forming a sacrificial layer on the sidewall surface of the opening and the surface of the dielectric layer; performing a first etching process to remove the portion of the blocking film until the surface of the material film is exposed, the remaining portion of the blocking film forming the initial blocking layer; and after forming the initial blocking layer, performing a second etching process to remove the sacrificial layer.

Optionally, a process of forming the sacrificial film includes at least one of physical vapor deposition (PVD), chemical vapor deposition (CVD), and atomic layer deposition (ALD).

Optionally, the sacrificial film formed above the dielectric layer is thicker than the sacrificial film formed on the bottom and sidewall surfaces of the opening.

Optionally, the sacrificial film is made of a material including amorphous silicon, amorphous carbon, polycrystalline silicon, silicon oxide, silicon oxycarbide, or carboxysilane.

Optionally, during the first etching process, an etching rate of the blocking film is greater than an etching rate of the material film.

Optionally, during the second etching process, an etching rate of the sacrificial layer is greater than an etching rate of the material film, and the etching rate of the sacrificial layer is greater than an etching rate of the initial blocking layer.

Optionally, forming the conductive-material film in the opening, and above the top surface of the dielectric layer includes: forming an initial conductive-material film on the bottom and sidewall surfaces of the opening, and above the top surface of the dielectric layer; forming a seed layer on the initial conductive-material film; and forming a conductive-material filling film in the opening, and on a top surface of the seed layer.

Optionally, the process parameters used for performing the annealing process include an annealing temperature in a range of approximately 400° C. to 450° C.

Optionally, the conductive-material film is made of a material including at least one of Co, Cu, W, Al, Ti, and Ta.

Optionally, the material film is made of a material including at least one of Ti, Ni, Co, and W.

Optionally, the blocking film is made of a material including at least one of titanium nitride ($TiN_x$) and tantalum nitride ($TaN_x$).

Optionally, the contact layer is made of a material including at least one of $ABC_x$, $AC_x$, and $BC_x$, where A is a metal, including Co, W, or Cu; B is a metal, including Ti, Ni, or W; C is a semiconductor material, including Si, Ge, or Se; and x is a natural number greater than 1.

Another aspect of the present disclosure provides a method for forming a semiconductor structure. The method includes forming a dielectric layer on a substrate; forming an opening in the dielectric layer to expose a surface portion of the substrate; forming a blocking film on bottom and sidewall surfaces of the opening, and on a top surface of the dielectric layer; and removing a portion of the blocking film to expose the surface portion of the substrate at the bottom of the opening. The remaining portion of the blocking film forms an initial blocking layer. The method further includes forming a conductive-material film in the opening, and above the top surface of the dielectric layer; performing an annealing process to form a contact layer at the bottom of the opening by making the substrate at the bottom of the opening and the conductive-material film formed on the surface portion of the substrate react with each other; and after forming the contact layer, planarizing the conductive-material film and the initial blocking layer until the top surface of the dielectric layer is exposed. The remaining portion of the initial blocking layer forms a blocking layer on the sidewall surface of the opening; and the remaining portion of the conductive-material film forms a plug in contact with the blocking layer and the contact layer.

Optionally, removing the portion of the blocking film to expose the surface portion of the substrate at the bottom of the opening includes forming a sacrificial film on the blocking film; removing a portion of the sacrificial film until the portion of the blocking film at the bottom of the opening is exposed, a remaining portion of the sacrificial film forming a sacrificial layer; performing a first etching process to remove the portion of the blocking film until the surface portion of the substrate is exposed, the remaining portion of the blocking film forming the initial blocking layer; and after forming the initial blocking layer, performing a second etching process to remove the sacrificial layer.

Optionally, the sacrificial film is made of a material including amorphous silicon, amorphous carbon, polycrystalline silicon, silicon oxide, silicon oxycarbide, or carboxysilane.

Optionally, a process of forming the sacrificial film includes at least one of physical vapor deposition (PVD), chemical vapor deposition (CVD), and atomic layer deposition (ALD).

Optionally, the sacrificial film formed above the dielectric layer is thicker than the sacrificial film formed on the bottom and sidewall surfaces of the opening.

Optionally, forming the conductive-material film in the opening, and above the top surface of the dielectric layer includes forming an initial conductive-material film on the bottom and sidewall surfaces of the opening, and above the top surface of the dielectric layer; forming a seed layer on the initial conductive-material film; and forming a conductive-material filling film in the opening, and on a top surface of the seed layer.

Optionally, the process parameters used for performing the annealing process include an annealing temperature in a range of approximately 400° C. to 450° C.

Another aspect of the present disclosure provides a semiconductor structure. The semiconductor structure includes a substrate; and a dielectric layer formed on the substrate. The semiconductor structure also includes an opening formed through the dielectric layer; a contact layer formed at the bottom of the opening; a blocking layer formed on a sidewall surface of the opening; and a plug formed in the opening. The plug is formed on the sidewall surface of the blocking layer and in contact with the contact layer.

Optionally, the semiconductor structure further includes a material layer formed between the blocking layer and the plug.

Optionally, the plug is made of a material including at least one of Co, Cu, W, Al, Ti, and Ta.

Optionally, the blocking layer is made of a material including at least one of titanium nitride ($TiN_x$) and tantalum nitride ($TaN_x$).

Optionally, the contact layer is made of a material including at least one of $ABC_x$, $AC_x$, and $BC_x$, where A is a metal, including Co, W, or Cu; B is a metal, including Ti, Ni, or W; C is a semiconductor material, including Si, Ge, or Se; and x is a natural number greater than 1.

According to the disclosed methods and semiconductor structures, by removing the blocking film at the bottom of the opening, the surface of the material film is exposed at the bottom of the opening, such that the conductive-material film that is subsequently formed to fill the opening is able to directly in contact with the surface of the material film. In the meantime, the material film is also formed on the bottom and sidewall surfaces of the opening, that is, a portion of the material film is directly in contact with the surface of the substrate. Because the conductive-material film is directly in contact with the material film, and the material film is directly in contact with the substrate, an annealing process is performed to allow the conductive-material film, the material film, and the substrate to react with each other and thus form a contact layer. The resistance of the formed contact layer may be low, which is conducive to reducing the contact resistance in the semiconductor structure. As such, the performance of the formed semiconductor structure may be improved. In addition, the annealing temperature required for forming the contact layer during the annealing process is low, which is conducive to reducing the process cost. Moreover, the low annealing temperature may also prevent other semiconductor structures from being damaged during the annealing process.

Further, the annealing process is performed not only to form the contact layer, but also to anneal the conductive-material film, that is formed in the opening, at a certain annealing temperature. As such, the metal lattice in the conducive-material film may be able to grow sufficiently, which may be conducive to reducing the process cost.

Further, the portion of the blocking film formed at the bottom of the opening is removed, such that an initial blocking layer is formed on the sidewall surface of the opening, and above the surface of the dielectric layer. As such, the resistance between the substrate and the plug formed in the opening may be further reduced. In addition, the initial blocking layer may be able to preventing ions in the plug from diffusing into the dielectric layer. Therefore, the performance of the formed semiconductor structure may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

In order to form an electrical connection, an opening is usually formed in an interlayer dielectric layer, and then a metal layer is formed on the bottom and sidewall surfaces of the opening. A thermal annealing process is further performed to make the metal layer react with the substrate to form a metal silicide layer. However, the semiconductor structure fabricated through the process described above may not have desired electrical performance.

FIGS. 1-4 illustrate schematic cross-sectional views of semiconductor structures at certain stages of a fabrication process of a semiconductor structure.

Figure 1:
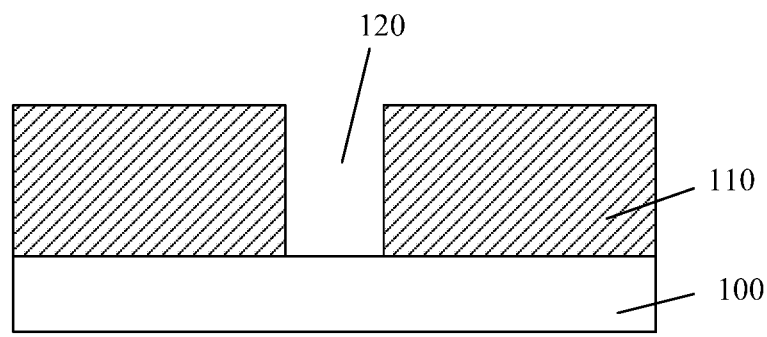
FIGS. 1-4 illustrate schematic cross-sectional views of semiconductor structures at certain stages of a fabrication process of a semiconductor structure.

Referring to FIG. 1, a substrate 100 is provided. A dielectric layer 110 is formed on the surface of the substrate 100, and an opening 120 is formed in the dielectric layer 110. A surface portion of the substrate 100 is exposed at the bottom of the opening 120.

Figure 2:
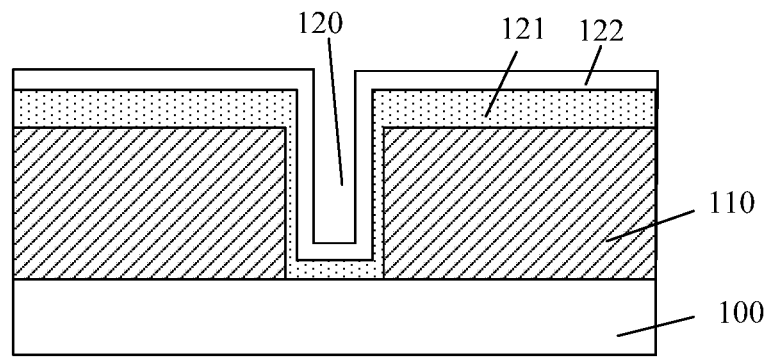

Referring to FIG. 2, a material film 121 is formed on the bottom and sidewall surfaces of the opening 120, and a blocking film 122 is formed on the surface of the material film 121.

Figure 3:
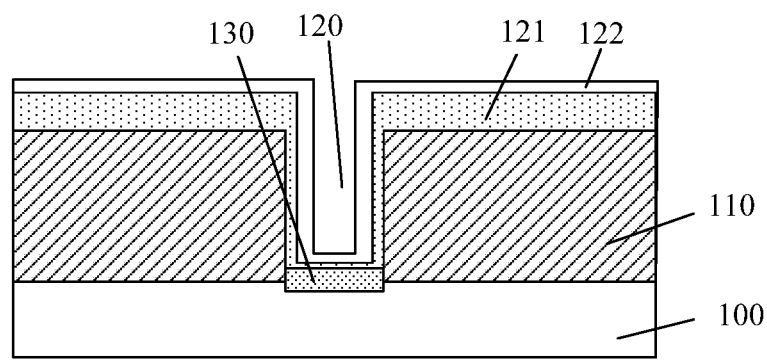

Referring to FIG. 3, by performing an annealing process, a portion of the material film 121 located at the bottom of the opening 120 reacts with the substrate 100, such that a contact layer 130 is formed on the bottom of the opening 120.

Figure 4:
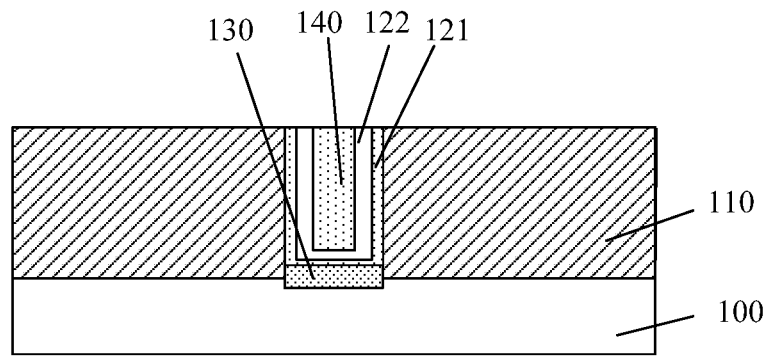

Further, referring to FIG. 4, after forming the contact layer 130, a contact plug 140 is formed in the opening 120 (referring to FIG. 3).

According to the method described above, a portion of the material film 121 located at the bottom of the opening 120 reacts with the substrate 100, thereby forming the contact layer 120. As such, the contact resistance between the plug 140 formed in the opening 120 and the substrate 100 is reduced, which is conducive to improving the performance of the formed semiconductor structure.

However, the material film 121 is usually made of titanium, and the substrate 100 is usually made of silicon. Further, the annealing process is performed to make a portion of the material film 121 react with the substrate 100, and thus form metal silicide. To reduce the resistance of the contact layer, a desired metal silicide to form is titanium silicide of the C54 crystal phase because the resistance of titanium silicide of the C54 crystal phase is low. However, it is difficult for the existing annealing process to form titanium silicide of the C54 crystal phase, and thus the resistance of the formed contact layer is still high. Therefore, the performance of the formed semiconductor structure is still undesired. Moreover, in order to allow the material film 121 to fully react with the substrate 100 in a relatively short period of time and avoid the influence of high temperature on other semiconductor structures, a laser annealing process with a relatively high cost needs to be used for annealing, which results in a corresponding increase of process cost.

Figure 13:
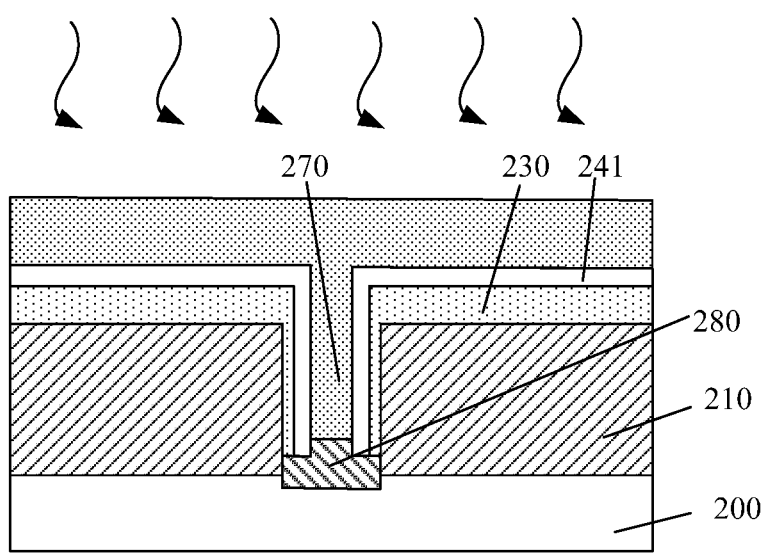
Figure 14:
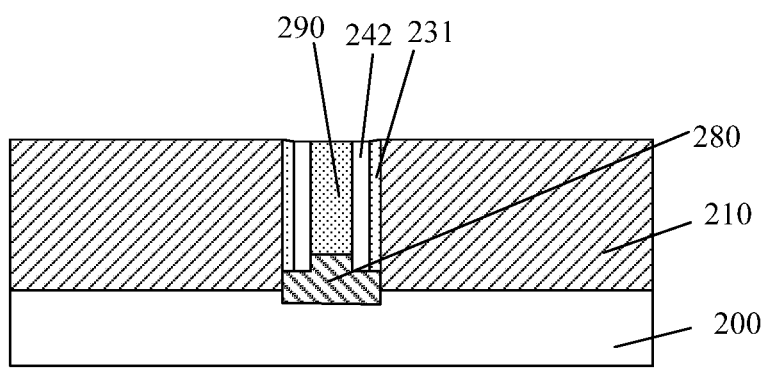
Figure 15:
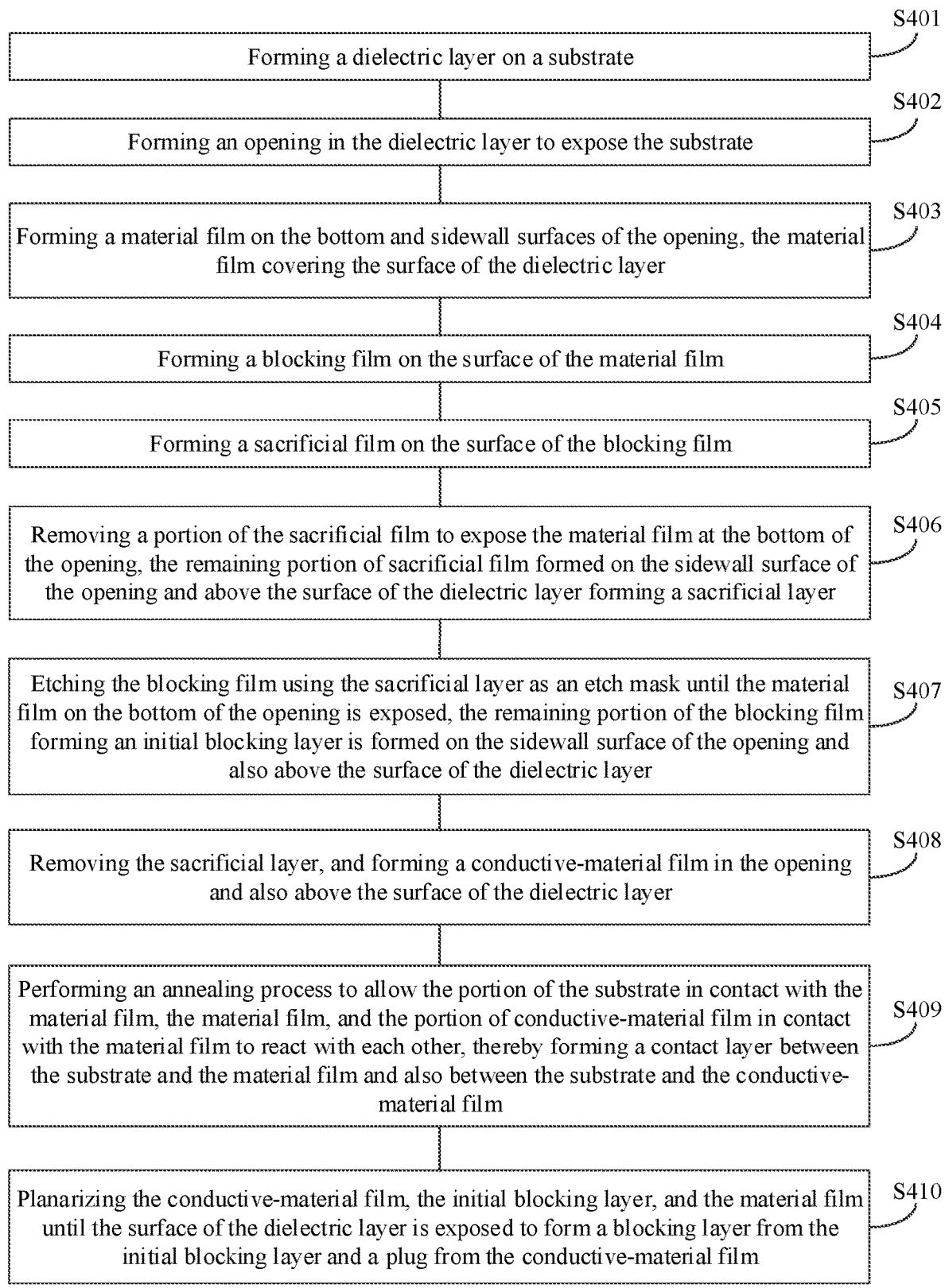
FIG. 15 illustrates a flowchart of an exemplary method for fabricating a semiconductor structure consistent with some embodiments of the present disclosure.

The present disclosure provides a method for forming a semiconductor structure. FIG. 15 illustrates a flowchart of an exemplary method for fabricating a semiconductor structure consistent with some embodiments of the present disclosure, and FIGS. 5-14 illustrate schematic views of semiconductor structures at certain stages of the exemplary method.

Figure 5:
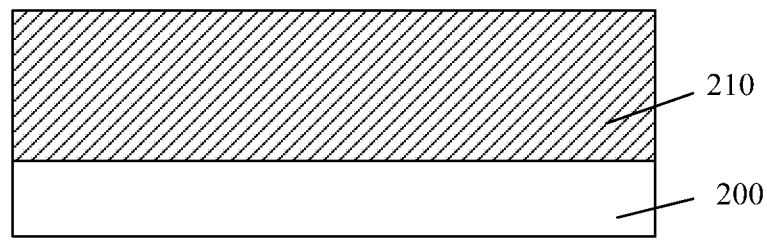
FIGS. 5-14 illustrate schematic cross-sectional views of semiconductor structures at certain stages of an exemplary method for fabricating a semiconductor structure consistent with some embodiments of the present disclosure.

Referring to FIG. 15, at beginning of the fabrication process, a dielectric layer may be formed on a substrate (S401). FIG. 5 illustrates a schematic cross-sectional view of a semiconductor structure consistent with various embodiments of the present disclosure.

Referring to FIG. 5, a substrate 200 may be provided, and a dielectric layer 210 may be formed on the surface of the substrate 200.

In one embodiment, the substrate 200 may include a base substrate (not shown) and a structural layer (not shown) located on the surface of the base substrate. The structural layer may include a plurality of device structures, including but not limited to P-type metal-oxide-semiconductor (PMOS) transistors, and/or N-type metal-oxide-semiconductor (NMOS) transistors. The structural layer may also include a plurality of interconnection structures that are connected to the plurality of device structures. The structural layer may further include an insulating layer surrounding the plurality of device structures and the plurality of interconnection structures.

The substrate 200 may be made of a semiconductor material. In one embodiment, the substrate 200 may be made of silicon. In other embodiments, the substrate may be made of silicon carbide (SiC), silicon germanium (SiGe), a multi-component semiconductor materials formed by Group III-V elements, or may have a composite semiconductor structure, such as silicon on insulator (SOI), germanium on insulator (GOI), etc. The multi-component semiconductor materials formed by Group III-V elements may include InP, GaAs, GaP, InAs, InSb, InGaAs, InGaAsP, or a combination thereof.

The dielectric layer 210 may be used to provide a support for an opening formed in a subsequent process and for a plug formed in the opening. The dielectric layer 210 may be formed by a material including one or more of silicon oxide ($SiO_x$), silicon nitride ($SiN_x$), silicon carbonitride (SiCN), silicon boronitride (SiBN), silicon oxynitride (SiON), or a combination thereof. In one embodiment, the dielectric layer 210 may be made of silicon oxide.

Figure 6:
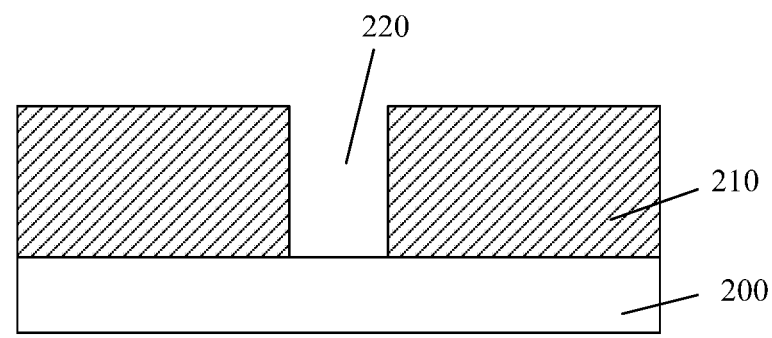

Further, returning to FIG. 15, an opening may be formed in the dielectric layer, a surface portion of the substrate may be exposed at the bottom of the opening (S402). FIG. 6 illustrates a schematic cross-sectional view of a semiconductor structure consistent with various embodiments of the present disclosure.

Referring to FIG. 6, an opening 220 may be formed in the dielectric layer 210. After forming the opening 220, a surface portion of the substrate 200 may be exposed at the bottom of the opening 220.

In one embodiment, the opening 220 may be subsequently filled by a conductive material layer to form a plug. The process of forming the opening may include the following exemplary steps. First, a patterned layer (not shown) may be formed on the surface of the dielectric layer 210, and the patterned layer may expose a portion of the surface of the dielectric layer 210. Further, the dielectric layer 210 may be etched using the patterned layer as an etch mask until a surface portion of the substrate 200 is exposed. As such, the opening 220 may be formed.

Further, the dielectric layer 210 may be etched through a dry etching process, a wet etching process, or a process combining dry etching and wet etching. In one embodiment, the dielectric layer 210 may be etched by an anisotropic dry etching process.

Figure 7:
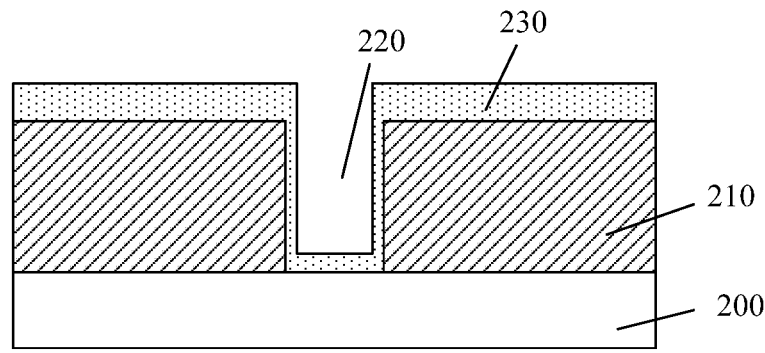

Further, returning to FIG. 15, a material film may be formed on the bottom and sidewall surfaces of the opening, and on the surface of the dielectric layer (S403). FIG. 7 illustrates a schematic cross-sectional view of a semiconductor structure consistent with various embodiments of the present disclosure.

Referring to FIG. 7, a material film 230 may be formed on the bottom and sidewall surfaces of the opening 220. The material film 230 may also cover the surface of the to dielectric layer 210.

The material film 230 may be used to form a contact layer in a subsequent process, such that the resistance may be reduced. The material film 230 may be made of a material including one or more of titanium, nickel, cobalt, and tungsten. In one embodiment, the material film 230 may be made of titanium.

The material film 230 may be formed by a chemical vapor deposition (CVD) process or a physical vapor deposition (PVD) process. In one embodiment, the material film 230 may be formed by a PVD process. By adopting the PVD process for forming the material film 230, the dimension of the portion of the material film 230 formed on the sidewall surface of the opening 220 may be small, which may be conducive to reducing the resistance of the formed semiconductor structure. As such, the performance of the formed semiconductor structure may be desired.

Figure 8:
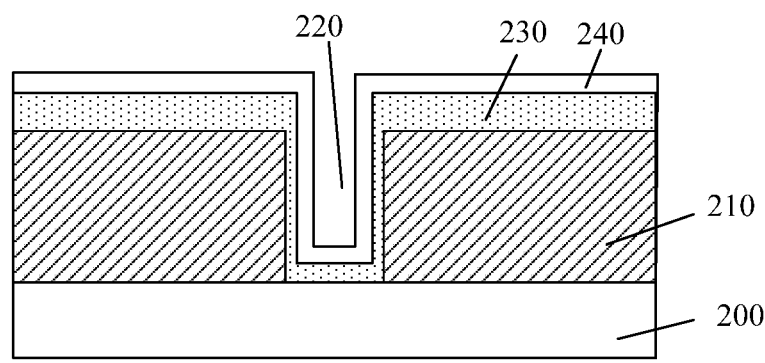

Further, returning to FIG. 15, a blocking film may be formed on the surface of the material film (S404). FIG. 8 illustrates a schematic cross-sectional view of a semiconductor structure consistent with various embodiments of the present disclosure.

Referring to FIG. 8, a blocking film 240 may be formed on the surface of the material layer 230. The blocking layer 240 may be used to prevent ions in the conductive material that is used to fill the opening 220 from diffusing into the dielectric layer 210. As such, the occurrence of electric leakage may be reduced, which may be conducive to the performance of the formed semiconductor structure.

The blocking layer 240 may be made of a material including at least one of titanium nitride and tantalum nitride. In one embodiment, the blocking layer 240 may be made of titanium nitride.

Figure 9:
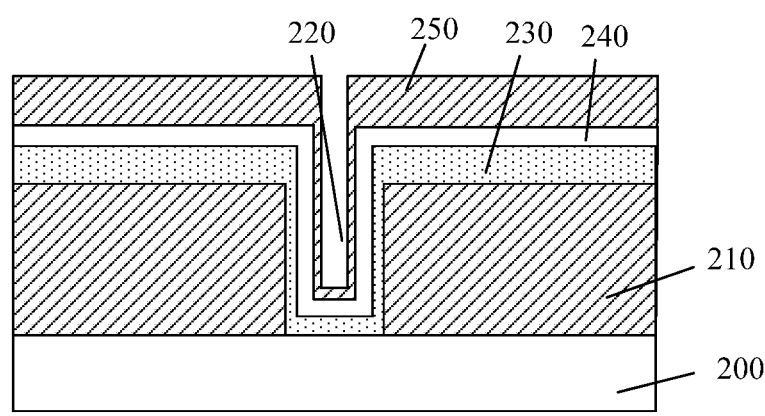

Further, returning to FIG. 15, a sacrificial film may be formed on the surface of the blocking layer (S405). FIG. 9 illustrates a schematic cross-sectional view of a semiconductor structure consistent with various embodiments of the present disclosure.

Referring to FIG. 9, a sacrificial film 250 may be formed on the surface of the blocking layer 240. The sacrificial layer 250 may be used to subsequently form a sacrificial layer, which may serve as a mask.

The sacrificial film 250 may be formed by a PVD process, a CVD process, or an atomic layer deposition (ALD) process. In addition, the thickness of the sacrificial film 250 formed on the dielectric layer 210 may be larger than the thickness of the sacrificial film 250 formed on the bottom surface of the opening 220.

In one embodiment, the sacrificial film 250 may be formed by a PVD process. Adopting the PVD process to form the sacrificial film 250 may be able to ensure that the thickness of the sacrificial film 250 formed on the dielectric layer 210 is larger than the thickness of the sacrificial film 250 formed on the material film 230 at the bottom surface of the opening 220. That is, the thickness of the sacrificial film 250 formed on the dielectric layer 210 may be larger than the thickness of the sacrificial film 250 formed on the bottom surface of the opening 220. As such, when subsequently performing an etching process to remove the portion of the sacrificial film 250 formed on the bottom of the opening and expose the material film 230 at the bottom of the opening 220, a portion of the sacrificial film 250 may still remain on the surface of the blocking film 240. Therefore, undesired effects on the material film 230 formed on the surface of the dielectric layer 210 and the blocking film 240 formed on the surface of the material film 230 due to the subsequently-performed etching process may be reduced or prevented, and thus the performance of the formed semiconductor structure may be improved.

The sacrificial film 250 may be made of amorphous silicon, amorphous carbon, polycrystalline silicon, silicon oxide, silicon oxycarbide, or carboxysilane. Correspondingly, the sacrificial layer formed subsequently by removing a portion of the sacrificial film 250 may also be made of amorphous silicon, amorphous carbon, polycrystalline silicon, silicon oxide, silicon oxycarbide, or carboxysilane. In one embodiment, the sacrificial film 250 may be made of amorphous silicon.

Figure 10:
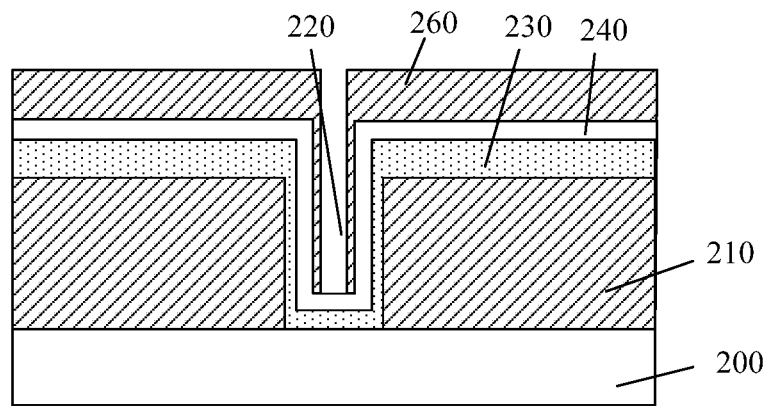

Further, returning to FIG. 15, a portion of the sacrificial film may be removed to expose the material film at the bottom of the opening, such that the remaining portion of the sacrificial film formed on the sidewall surface of the opening, and above the surface of the dielectric layer forms a sacrificial layer (S406). FIG. 10 illustrates a schematic cross-sectional view of a semiconductor structure consistent with various embodiments of the present disclosure.

Referring to FIG. 10, a portion of the sacrificial film 250 (referring to FIG. 9) may be removed by an etching process to expose the material film 240 at the bottom of the opening 220. A sacrificial layer 260 may be formed on the sidewall surface of the opening 220 and above the surface of the dielectric layer 210 from the remaining portion of the sacrificial film 250. The sacrificial layer 260 may be used as an etch mask when etching the blocking film 240 in a subsequent process.

The portion of the sacrificial film 250 may be removed by a dry etching process, a wet etching process, or a process combining dry etching and wet etching. In one embodiment, the portion of the sacrificial film 250 may be removed by a dry etching process.

Figure 11:
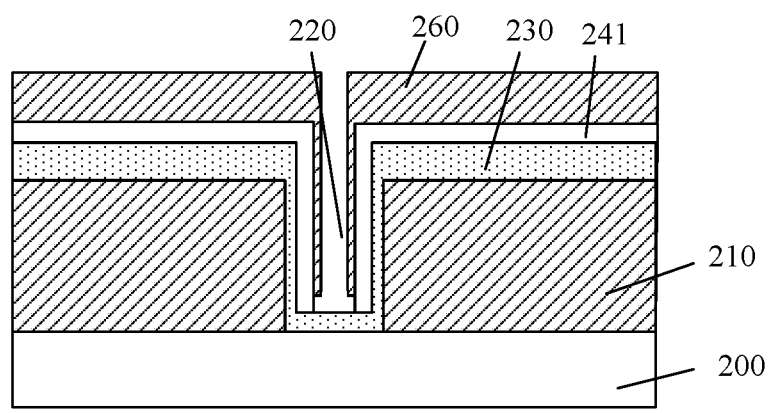

Returning to FIG. 15, the blocking film may be etched using the sacrificial layer as an etch mask until the material film on the bottom of the opening is exposed, such that the remaining portion of the blocking film may form an initial blocking layer on the sidewall surface of the opening, and above the surface of the dielectric layer (S407). FIG. 11 illustrates a schematic cross-sectional view of a semiconductor structure consistent with various embodiments of the present disclosure.

Referring to FIG. 11, a portion of the blocking film 240 (referring to FIG. 10) may be removed by a first etching process using the sacrificial layer 260 as an etch mask until the material film 230 at the bottom of the opening 220 is exposed. An initial blocking layer 241 may be formed on the sidewall surface of the opening 220 and above the surface of the dielectric layer 210 from the remaining portion of the blocking film 240. The initial blocking layer 241 formed by etching the blocking film 240 may be further used to form a blocking layer in a subsequent process.

By removing the portion of the blocking film 240 at the bottom of the opening 220 to form the initial blocking layer 241 on the sidewall surface of the opening 220 and also above the surface of the dielectric layer 210, the resistance between the substrate 200 and a plug subsequently formed in the opening 220 may be further reduced. In addition, the initial blocking layer 241 may also be able to prevent ions in the plug from diffusing into the dielectric layer 210. Therefore, the performance of the formed semiconductor structure may be improved.

During the first etching process, the etching rate of the blocking film 240 may be larger than the etching rate of the material film 230. The first etching process may be a dry etching process, a wet etching process, or a process combining dry etching and wet etching. In one embodiment, the first etching process may be a wet etching process.

In one embodiment, when the blocking film 240 at the bottom of the opening 220 is removed to form the initial blocking layer 241, the material film 230 may be exposed at the bottom of the opening 220. Because the etching rate of the blocking film 240 is larger than the etching rate of the material film 230 during the first etching process, the etching rate of the material film 230 exposed at the bottom of the opening 220 may be small, thereby avoiding excessive etching of the material film 230. As such, the material film 230 may be ensured to have a sufficient thickness for subsequent formation of a contact layer, which may be conducive to reducing the resistance. Therefore, the performance of the formed semiconductor structure may be improved.

Figure 12:
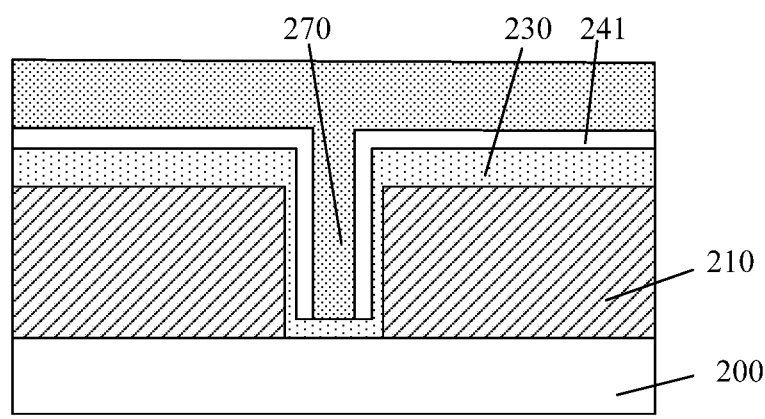

Further, returning to FIG. 15, after forming the initial blocking layer, the sacrificial layer may be removed, and then a conductive-material film may be formed in the opening, and above the surface of the dielectric layer (S408). FIG. 12 illustrates a schematic cross-sectional view of a semiconductor structure consistent with various embodiments of the present disclosure.

Referring to FIG. 12, after forming the initial blocking layer 241, the sacrificial layer 260 (referring to FIG. 11) may be removed by a second etching process. Further, a conductive-material layer 270 may be formed to fill the opening 220 (referring to FIG. 11). The conductive-material layer 270 may also cover the surface of the initial blocking layer 241.

During the second etching process, the etching rate of the sacrificial layer 260 may be larger than the etching rate of the material film 230, and the etching rate of the sacrificial layer 260 may also be larger than the etching rate of the initial blocking layer 241. The second etching process may be a dry etching process, a wet etching process, or a process combining dry etching and wet etching. In one embodiment, the second etching process may be a wet etching process.

In one embodiment, the etching rate of the sacrificial layer 260 may be larger than the etching rate of the material film 230 during the second etching process. Therefore, when removing the sacrificial layer 260, damage to the material film 230 may be limited. As such, the material film 230 may be ensured to have a sufficient thickness for subsequent formation of a contact layer, which may be conducive to reducing the resistance. Therefore, the performance of the formed semiconductor structure may be improved.

Moreover, the etching rate of the sacrificial layer 260 may be larger than the etching rate of the initial blocking layer 241 during the second etching process. Therefore, when removing the sacrificial layer 260, damage to the initial blocking layer 241 formed on the sidewall surface of the opening 220 may be limited. As such, the initial blocking layer 241 may have a sufficient thickness for preventing ions in the conducive material, which is subsequently filled into the opening 220 to form the conductive-material film 270, from diffusing into the dielectric layer 210. Therefore, the performance of the formed semiconductor structure may be improved.

The conductive-material film 270 may be used to form a plug in a subsequent process. The conductive-material film 270 may be formed by a method including the following exemplary steps. An initial conductive-material film (not shown) may be formed on the bottom and sidewall surfaces of the opening 220 and also on the surface of the initial blocking layer 241 that is formed above the dielectric layer 210. A seed layer (not shown) may then be formed on the surface of the initial conductive-material film. After forming the seed layer, a conductive-material filling film (not shown) may be formed in the opening 220 and also on the surface of the seed layer. The conductive-material filling film may fill up the opening 220. Further, a planarization process may be performed on the initial conductive-material film, the seed layer, and the conductive-material filling film to form the conductive-material film 270.

The initial conductive-material film may be made of one or more of cobalt, cupper, tungsten, aluminum, titanium, and tantalum. The seed layer may be made of one or more of cobalt, cupper, tungsten, aluminum, titanium, and tantalum. The conductive-material filling film may be made of one or more of cobalt, cupper, tungsten, aluminum, titanium, and tantalum. In one embodiment, the initial conductive-material film, the seed layer, and the conductive-material filling film may all be made of cobalt. Because the resistivity of cobalt is small, after performing a planarization process to form the conductive-material film 270 and then subsequently forming a plug from the conductive-material film 270, the resistance of the plug may be small, thereby improving the performance of the formed semiconductor structure.

Further, returning to FIG. 15, an annealing process may be performed to allow the portion of the substrate in contact with the material film, the material film, and the portion of conductive-material film in contact with the material film to react with each other, thereby forming a contact layer between the substrate and the material film and also between the substrate and the conductive-material film (S409). FIG. 13 illustrates a schematic cross-sectional view of a semiconductor structure consistent with various embodiments of the present disclosure.

Referring to FIG. 13, an annealing process may be performed, such that the portion of the substrate 200 in contact with the material film 230 at the bottom of the opening 220 (referring to FIG. 11) may react with the material film 230 and the conductive-material film 270 formed on the material film 230. After performing the annealing process, a contract layer 280 may be formed between the substrate 200 and the material film 230 and also between the substrate 200 and the conductive-material film 270.

The annealing temperature used in the annealing process may not be too low. For example, when the annealing temperature is lower than 100° C., the conductive-material film 270, the material film 230, and the substrate 200 may not sufficiently react when forming the contact layer 280, and thus the resistance of the contact layer 280 may not be reduced as desired. In addition, an excessively low annealing temperature may not be able to allow the crystal lattice in the conductive-material film 270 to grow sufficiently, resulting in undesired performance of the formed plug. Therefore, an annealing temperature lower than 100° C. may not be conducive to improving the performance of the formed semiconductor structure. Moreover, the annealing temperature used in the annealing process may not be too high. When the annealing temperature is higher than 800° C., the high annealing temperature may damage devices that have been formed in the semiconductor structure and thus lead to degradation of the performance. In addition, the high annealing temperature may not be conducive to reducing the production cost. Therefore, the annealing temperature used in the annealing process may be in a range of approximately 100° C. to 800° C. That is, during the annealing process, the annealing temperature may be 300° C., 400° C., 450° C., 500° C., or 600° C. In one embodiment, to ensure sufficient reaction of the materials and also avoid high-temperature damages to the semiconductor structure, the process parameters used for performing the annealing process may include an annealing temperature in a range of approximately 400° C. to 450° C.

According to the disclosed method, by removing the portion of the blocking film 240 (referring to FIG. 10) at the bottom of the opening 220, the surface of a portion of the material film 230 may be exposed at the bottom of the opening 220, such that the subsequently formed conductive-material film 270 may be in contact with the surface of the material film 230. In the meantime, the material film 230 may also be formed on the bottom and sidewall surfaces of the opening 220, that is, a portion of the material film may be in contact with the surface of the substrate 200. Because the conductive-material film 270 and the material film 230 are directly in contact with each other, and the material film 230 and the substrate 200 are directly in contact with each other as well, by performing an annealing process, the conductive-material film 270, the material film 230, and the substrate 200 may react with each other to form the contact layer 280. Moreover, the resistance of the formed contact layer 280 may be low, which may be conducive to reducing the contact resistance. Therefore, the performance of the formed semiconductor structure may be improved. Further, the annealing temperature required for the annealing process to form the contact layer 280 may be relatively low, which may be conducive to reducing the production cost. In the meantime, damage to other semiconductor structures caused by an excessively high annealing temperature may also be prevented.

The annealing process may be performed not only to form the contact layer 280, but also to anneal the conductive-material film 270, that is filled into the opening 220 (referring to FIG. 10), at a certain annealing temperature. As such, the metal lattice in the conducive-material film 270 may be able to grow sufficiently, which may be conducive to reducing the process cost.

The contact layer 280 may include one or more types of $ABC_x$, $AC_x$, or $BC_x$, where A is a metal, including Co, W, or Cu; B is also a metal, including Ti, Ni, or W; C is a semiconductor material, including Si, Ge, or Se; and x is a natural number greater than 1.

In one embodiment, the conductive-material film 270 may be made of Co, the substrate 200 may be made of silicon, and the material film may be made of Ti. The formed contact layer 280 may include a cobalt-titanium-silicon compound, a cobalt-titanium compound, and a titanium-silicon compound.

Further, returning to FIG. 15, after forming the contact layer, the conductive-material film, the initial blocking layer, and the material film may be planarized until the surface of the dielectric layer is exposed, such that a blocking layer may be formed on the sidewall surface of the opening, and a plug, in contact with the contact layer, may be formed on the surface of the blocking layer (S410). FIG. 14 illustrates a schematic cross-sectional view of a semiconductor structure consistent with various embodiments of the present disclosure.

Referring to FIG. 14, after forming the contact layer 280, the conductive-material film 270, the initial blocking layer 241, and the material film 230 may be planarized until the surface of the dielectric layer 210 is exposed. As such, a blocking layer 242 may be formed on the sidewall surface of the opening 220 (referring to FIG. 10), and a plug 290 may be formed in the opening 220. The plug 290 may be in contact with the blocking layer 242 and the contact layer 280.

The conductive-material film 270, the initial blocking layer 241, and the material film 230 may be planarized by a chemical mechanical planarization (CMP) process. The plug 290 may be formed from the conductive-material film 270 after the planarization process, and thus the plug may be made of one or more of cobalt, cupper, tungsten, aluminum, titanium, and tantalum. In one embodiment, the conducive-material film 270 may be made of cobalt, and correspondingly, the plug 290 may also be made of cobalt.

In one embodiment, a material layer 231 may be formed on the sidewall surface of the opening 220 (referring to FIG. 10), and the material layer 231 may be formed from the material film 230 after the planarization process. The material layer 231 may be disposed between the blocking layer 242 and the plug 290. In other embodiments, the semiconductor structure may not include the material layer, that is, the material film may not be formed prior to forming the blocking film.

The present disclosure also provides a semiconductor structure formed by the method described above. FIG. 14 illustrates a schematic cross-sectional view of an exemplary semiconductor structure consistent with various embodiments of the present disclosure.

Referring to FIG. 14, the semiconductor structure may include a substrate 200, a dielectric layer 210 formed on the substrate 200, an opening (not labeled) formed through the dielectric layer 210; a contact layer 280 formed on the bottom of the opening in contact with the substrate 200; a blocking layer 242 formed on the sidewall surface of the opening, and a plug 290 formed in the opening. The plug 290 may be formed on the sidewall surface of the blocking layer 242 and may be in contact with the top surface of the contact layer 280.

In one embodiment, the plug 290 may be made of one or more of cobalt, cupper, tungsten, aluminum, titanium, and tantalum. The blocking layer 242 may be made of a material, including at least one of titanium nitride and tantalum nitride.

In one embodiment, the semiconductor structure may further include a material layer 231 formed between the blocking layer 242 and the plug 290. In other embodiments, the semiconductor structure may not include the material layer.

Compared to existing semiconductor structures and fabrication methods, the disclosed semiconductor structures and fabrication methods may demonstrate the following exemplary advantages.

According to the disclosed methods and semiconductor structures, by removing the blocking film at the bottom of the opening, the surface of the material film is exposed at the bottom of the opening, such that the conductive-material film that is subsequently formed to fill the opening is able to directly in contact with the surface of the material film. In the meantime, the material film is also formed on the bottom and sidewall surfaces of the opening, that is, a portion of the material film is directly in contact with the surface of the substrate. Because the conductive-material film is directly in contact with the material film, and the material film is directly in contact with the substrate, an annealing process is performed to allow the conductive-material film, the material film, and the substrate to react with each other and thus form a contact layer. The resistance of the formed contact layer may be low, which is conducive to reducing the contact resistance in the semiconductor structure. As such, the performance of the formed semiconductor structure may be improved. In addition, the annealing temperature required for forming the contact layer during the annealing process is low, which is conducive to reducing the process cost. Moreover, the low annealing temperature may also prevent other semiconductor structures from being damaged during the annealing process.

Further, the annealing process is performed not only to form the contact layer, but also to anneal the conductive-material film, that is formed in the opening, at a certain annealing temperature. As such, the metal lattice in the conducive-material film may be able to grow sufficiently, which may be conducive to reducing the process cost.

Further, the portion of the blocking film formed at the bottom of the opening is removed, such that an initial blocking layer is formed on the sidewall surface of the opening, and above the surface of the dielectric layer. As such, the resistance between the substrate and the plug formed in the opening may be further reduced. In addition, the initial blocking layer may be able to preventing ions in the plug from diffusing into the dielectric layer. Therefore, the performance of the formed semiconductor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
   forming a dielectric layer on a substrate;
   forming an opening in the dielectric layer to expose a surface portion of the substrate;
   forming a material film on bottom and sidewall surfaces of the opening, and on a top surface of the dielectric layer;
   forming a blocking film on the material film;
   removing a portion of the blocking film to expose a surface of the material film at the bottom of the opening, wherein a remaining portion of the blocking film forms an initial blocking layer;
   forming a conductive-material film in the opening, and above the top surface of the dielectric layer;
   performing an annealing process to form a contact layer at the bottom of the opening by making the substrate at the bottom of the opening, the material film at the bottom of the opening, and the conductive-material film formed on the surface of the material film react with each other; and
   after forming the contact layer, planarizing the conductive-material film, the initial blocking layer, and the material film until the top surface of the dielectric layer is exposed, wherein:
     a remaining portion of the initial blocking layer forms a blocking layer on the sidewall surface of the opening; and
     a remaining portion of the conductive-material film forms a plug in contact with the blocking layer and the contact layer.

2. The method according to claim 1, wherein removing the portion of the blocking film to expose the surface of the material film at the bottom of the opening includes:
   forming a sacrificial film on the blocking film;
   removing a portion of the sacrificial film until the portion of the blocking film at the bottom of the opening is exposed, a remaining portion of the sacrificial film forming a sacrificial layer;
   performing a first etching process to remove the portion of the blocking film until the surface of the material film is exposed, the remaining portion of the blocking film forming the initial blocking layer; and
   after forming the initial blocking layer, performing a second etching process to remove the sacrificial layer.

3. The method according to claim 2, wherein:
   a process of forming the sacrificial film includes at least one of physical vapor deposition (PVD), chemical vapor deposition (CVD), and atomic layer deposition (ALD).

4. The method according to claim 2, wherein.
   the sacrificial film formed above the dielectric layer is thicker than the sacrificial film formed on the bottom and sidewall surfaces of the opening.

5. The method according to claim 2, wherein:
   the sacrificial film is made of a material including amorphous silicon, amorphous carbon, polycrystalline silicon, silicon oxide, silicon oxycarbide, or carboxysilane.

6. The method according to claim 2, wherein:
   during the first etching process, an etching rate of the blocking film is greater than an etching rate of the material film; and
   during the second etching process, an etching rate of the sacrificial layer is greater than an etching rate of the material film, and the etching rate of the sacrificial layer is greater than an etching rate of the initial blocking layer.

7. The method according to claim 1, wherein forming the conductive-material film in the opening, and above the top surface of the dielectric layer includes:
   forming an initial conductive-material film on the bottom and sidewall surfaces of the opening, and above the top surface of the dielectric layer;
   forming a seed layer on the initial conductive-material film; and
   forming a conductive-material filling film in the opening, and on a top surface of the seed layer.

8. The method according to claim 1, wherein:
   process parameters used for performing the annealing process include an annealing temperature in a range of approximately 400° C. to 450° C.

9. The method according to claim 1, wherein:
   the conductive-material film is made of a material including at least one of Co, Cu, W, Al, Ti, and Ta; and
   the material film is made of a material including at least one of Ti, Ni, Co, and W.

10. The method according to claim 1, wherein:
    the contact layer is made of a material including at least one of $ABC_x$, $AC_x$, and $BC_x$, wherein A is a metal, including Co, W, or Cu; B is a metal, including Ti, Ni, or W; C is a semiconductor material, including Si, Ge, or Se; and x is a natural number greater than 1.

11. A method for forming a semiconductor structure, comprising:
    forming a dielectric layer on a substrate;
    forming an opening in the dielectric layer to expose a surface portion of the substrate;
    forming a blocking film on bottom and sidewall surfaces of the opening, and on a top surface of the dielectric layer;
    removing a portion of the blocking film to expose the surface portion of the substrate at the bottom of the opening, a remaining portion of the blocking film forming an initial blocking layer;
    forming a conductive-material film in the opening, and above the top surface of the dielectric layer;
    performing an annealing process to form a contact layer at the bottom of the opening by making the substrate at the bottom of the opening and the conductive-material film formed on the surface portion of the substrate react with each other; and after forming the contact layer, planarizing the conductive-material film and the initial blocking layer until the top surface of the dielectric layer is exposed, wherein:
a remaining portion of the initial blocking layer forms a blocking layer on the sidewall surface of the opening; and
a remaining portion of the conductive-material film forms a plug in contact with the blocking layer and the contact layer.

12. The method according to claim 11, wherein removing the portion of the blocking film to expose the surface portion of the substrate at the bottom of the opening includes:
forming a sacrificial film on the blocking film;
removing a portion of the sacrificial film until the portion of the blocking film at the bottom of the opening is exposed, wherein a remaining portion of the sacrificial film forms a sacrificial layer;
performing a first etching process to remove the portion of the blocking film until the surface portion of the substrate is exposed, the remaining portion of the blocking film forming the initial blocking layer; and
after forming the initial blocking layer, performing a second etching process to remove the sacrificial layer.

13. The method according to claim 12, wherein:
the sacrificial film is made of a material including amorphous silicon, amorphous carbon, polycrystalline silicon, silicon oxide, silicon oxycarbide, or carboxysilane;
a process of forming the sacrificial film includes at least one of physical vapor deposition (PVD), chemical vapor deposition (CVD), and atomic layer deposition (ALD); and
the sacrificial film formed above the dielectric layer is thicker than the sacrificial film formed on the bottom and sidewall surfaces of the opening.

14. The method according to claim 11, wherein forming the conductive-material film in the opening, and above the top surface of the dielectric layer includes:
forming an initial conductive-material film on the bottom and sidewall surfaces of the opening, and above the top surface of the dielectric layer;
forming a seed layer on the initial conductive-material film; and
forming a conductive-material filling film in the opening, and on a top surface of the seed layer.

15. The method according to claim 11, wherein:
process parameters used for performing the annealing process include an annealing temperature in a range of approximately 400° C. to 450° C.

* * * * *